(12) United States Patent
Chiu et al.

(10) Patent No.: US 7,064,421 B2
(45) Date of Patent: Jun. 20, 2006

(54) WIRE BONDING PACKAGE

(75) Inventors: Yu-Ling Chiu, Taipei (TW);
Chun-Ming Chen, Taipei (TW);
Wei-Chou Hung, Taipei (TW)

(73) Assignee: ALI Corporation, Taipei (TW)

( * ) Notice: Subject to any disclaimer, the term of this patent is extended or adjusted under 35 U.S.C. 154(b) by 185 days.

(21) Appl. No.: 10/708,705

(22) Filed: Mar. 19, 2004

(65) Prior Publication Data

US 2005/0133911 A1    Jun. 23, 2005

(30) Foreign Application Priority Data

Dec. 22, 2003    (TW) ............................... 92136381 A

(51) Int. Cl.
*H01L 23/02*    (2006.01)
(52) U.S. Cl. ................. 257/678; 257/784; 257/697
(58) Field of Classification Search ............... 257/734, 257/777, 782, 784, 666, 676, 678, 697
See application file for complete search history.

(56) References Cited

U.S. PATENT DOCUMENTS

| 4,513,355 | A | * | 4/1985 | Schroeder et al. | 361/767 |
| 6,121,686 | A | * | 9/2000 | Togawa | 257/778 |
| 6,281,572 | B1 | * | 8/2001 | Robbins | 257/700 |
| 6,417,532 | B1 | * | 7/2002 | Tsunoda et al. | 257/219 |
| 6,744,126 | B1 | * | 6/2004 | Chiang | 257/686 |
| 2002/0100967 | A1 | * | 8/2002 | Gaku et al. | 257/707 |
| 2003/0151133 | A1 | * | 8/2003 | Kinayman et al. | 257/713 |
| 2003/0162319 | A1 | * | 8/2003 | Crane et al. | 438/106 |
| 2004/0118587 | A1 | * | 6/2004 | Gilliland | 174/52.4 |
| 2004/0120128 | A1 | * | 6/2004 | Chang | 361/764 |

* cited by examiner

*Primary Examiner*—Douglas W. Owens
(74) *Attorney, Agent, or Firm*—Winston Hsu

(57) ABSTRACT

A wire bonding package has a housing having a plurality of pins, a circuit board installed inside the housing and having at least a trace connected to a pin of the housing, at least a die installed on the circuit board and having a plurality of bonding pads, and at least a bonding line connected between a bonding pad of the die and the trace of the circuit board so that the bonding pad of the die is electrically connected to the pin of the housing.

9 Claims, 5 Drawing Sheets

WIRE BONDING PACKAGE

BACKGROUND OF INVENTION

1. Field of the Invention

The present invention relates to a wire bonding package, and more particularly, to a wire bonding package having a housing and at least a die electrically connected to the housing via a circuit board.

2. Description of the Prior Art

In modern society with developed computer technology, the computer system, which comprises a plurality of integrated circuits, has been utilized in a broad spectrum of fields. For example, household appliances with automatic control systems, mobile communication devices, and personal computers utilize integrated circuits (IC) to perform certain functions. The main body of the IC is a die manufactured by a prior art semiconductor process. The semiconductor process to manufacture the die starts with forming a wafer. Each wafer is divided into a plurality of regions. On each of the regions, many circuits are formed through prior art semiconductor processes. In the end, each processed region on the wafer is sliced to generate a plurality of die. After the required die is obtained, the processed die is electrically connected with a circuit board such as a printed circuit board (PCB) in a specified way. Therefore, the die is capable of acquiring its operating voltage from the PCB for performing a predetermined operation. Generally speaking, the specific way to electrically connect the die with the circuit board includes connecting a bare chip (die) directly to the circuit board, or packaging the die inside a package in advance so that the die is electrically connected to the outer circuit board through a circuit layout within the package for receiving power and transmitting signals.

In recent years, a plurality of mutual supporting die have been integrated into a single package to meet the demand for time-to-market. Please refer to FIG. 1 and FIG. 2. FIG. 1 is a schematic diagram of a quad flat multi-die wire bonding package 10 having a first die 12 and a second die 14 stacked on the first die 12 according to the prior art. FIG. 2 is a side view of the wire bonding package 10 shown in FIG. 1. The wire bonding package 10 further comprises a plurality of bonding lines 24 and a housing 16 having a plurality of pins 18 installed. Both the first die 12 and the second die 14 comprise a core circuit for executing a predetermined operation and a plurality of input/output circuits for processing data accessed to/from the core circuit. The first die 12, and the second die 14 as well, further comprises a plurality of die pads 20, 22 for connecting to the pins 18 of the housing 16 via the bonding lines 24.

Usually, before being stacked together and installed inside the housing 16, the first die 12 and the second die 14 have to be re-designed to eliminate a bonding line crossing problem, for example a bonding line 74 connecting a die pad 84 and a pin 94 crossing a bonding line 72 connecting a die pad 82 and a pin 92 as indicated by arrow A, and crossing a bonding line 70 connecting a die pad 80 and a pin 90 as indicated by arrow B. However, the re-resign necessity of the first die 12 and the second die 14 complicates the demand for time-to-market.

Moreover, even if both the first die 12 and the second die 14 have been re-designed before being installed inside the housing 16 and do not have the bonding line crossing problem any more, as the circuits (for example the core circuit and the input/output circuit) inside the die are becoming more and more complicated and the capacity of the housing and the die as well are becoming smaller and smaller, data transmitted over the bonding line 72 connected between the pin 92 of the housing 16 and the die pad 82 of the first die 12 is likely interfered with by data transmitted over the bonding line 70 connected between the pin 90 of the housing 16 and the die pad 80 of the first die 12 due to a coupling effect resulting from the bonding lines 70 and 72 being too crowded. Therefore, the performance of the wire bonding package 10 is reduced, especially when the data transmitted over the bonding line 72 is analog data.

SUMMARY OF INVENTION

It is therefore a primary objective of the claimed invention to provide a wire bonding package having a circuit board installed to overcome the disadvantage of the coupling effect, a die of the wire bonding package capable of connecting a housing of the wire bonding package via the circuit board.

According to the claimed invention, the wire bonding package includes a housing having a plurality of pins installed, a circuit board installed inside the housing and having at least a trace connected to the pins of the housing, at least a die installed on the circuit board and having a plurality of bonding pads installed, and at least a bonding line connected between the bonding pads of the die and the trace of the circuit board so that the bonding pads of the die are electrically connected to the pins of the housing.

In the preferred embodiment, the wire bonding package has two die. These two die can be stacked together or adhered onto the circuit board.

The housing can be a ball grid array (BGA), a quad flat package (QFP), or a dual in-line package (DIP). The circuit board can have at least a passive component installed.

It is an advantage of the claimed invention that the bonding line can connect a die pad of the die to a pin of the housing selectively via at least two vias, the part of the bonding line between the two via shaving a layout on any layer of the circuit board, so that the bonding line crossing problem can be eliminated. Therefore, without being re-designed, a plurality of die of the wire bonding package can be integrated into the housing directly to meet the demand for time-to-market. Another advantage of the present invention is that the bonding line can connect a die pad of the die to a pin of the housing selectively via at least one solder pad to eliminate the coupling effect resulting from the bonding lines being too crowded and to increase the performance, the part of the bonding line neighboring the solder pad being installed away from any bonding lines of the wire bonding package. The third advantage of the present invention is that the circuit board can have at least a passive component installed according to the electric characteristics of the core circuit and the input/output circuits of the die. Therefore, when in fabrication, a circuit board having the wire bonding package installed does not have to have another properly selected and elaborately tuned passive components installed, so that the cost and time to manufacturing the wire bonding package is reduced dramatically.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3:
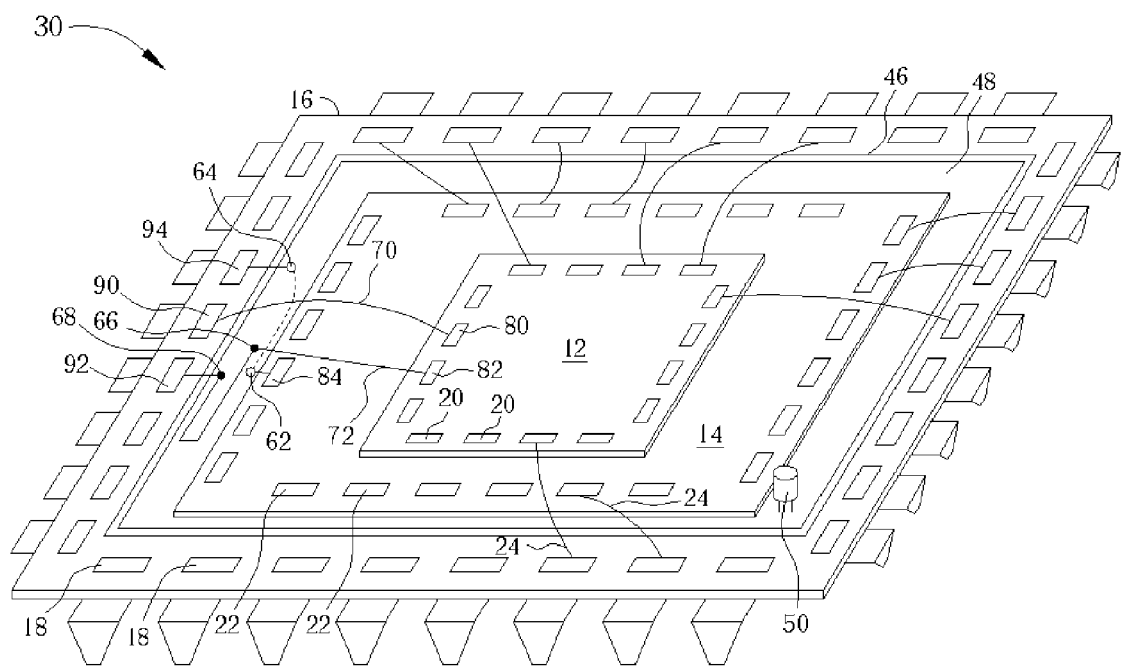
FIG. 3 is a schematic diagram of a wire bonding package of the preferred embodiment according to the present invention.
Figure 4:
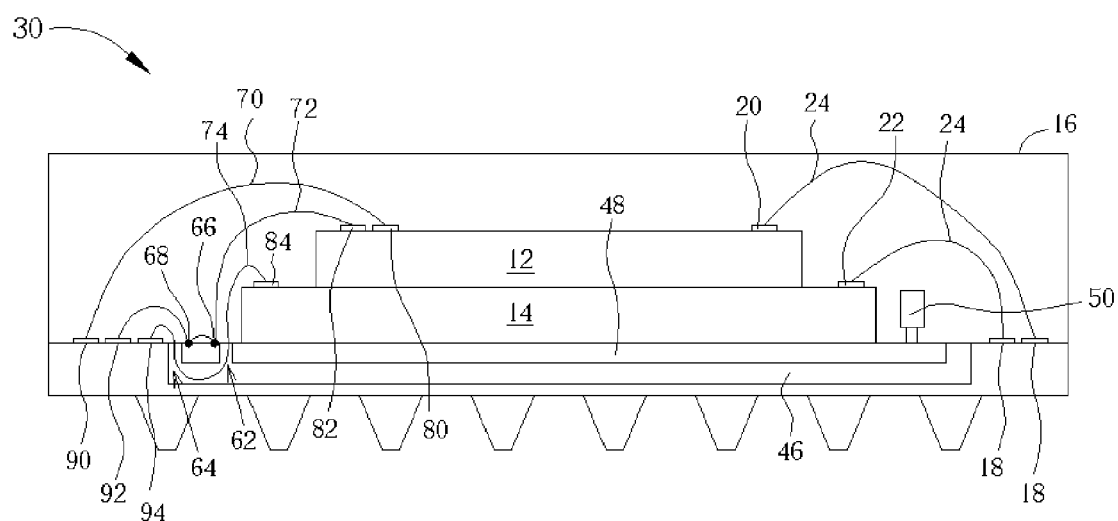
FIG. 4 is a side view of the wire bonding package shown in FIG. 3.

Please refer to FIG. 3 and FIG. 4. FIG. 3 is a schematic diagram of a wire bonding package 30 of the preferred embodiment according to the present invention. FIG. 4 is a side view of the wire bonding package 30. In addition to the first die 12, the second die 14, the housing 16 and the plurality of bonding lines 24 for electrically connecting the die pads 20, 22 to the pins 18 of the housing 16, the wire bonding package 30 further comprises a circuit board 48 accommodated in a lead frame 46 of the housing 16.

In the preferred embodiment, the housing 16 has a shape of a quad flat package (QFP) and the circuit board 48 is a dual-layer circuit board. Alternatively, in a wire bonding package of the present invention, the housing 16 can have a shape of a ball grid array (BGA) or a dual in-line package (DIP), and the circuit board 48 can be a single-layer circuit board or a circuit board of more than two layers.

Figure 1:
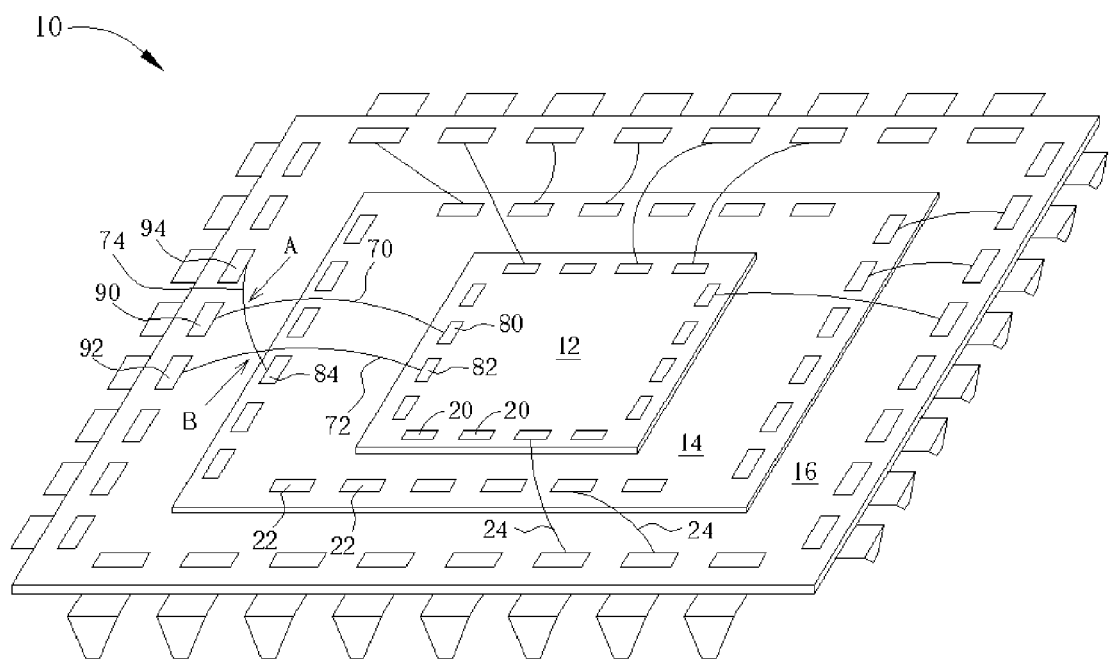
FIG. 1 is a schematic diagram of a wire bonding package according to the prior art.
Figure 2:
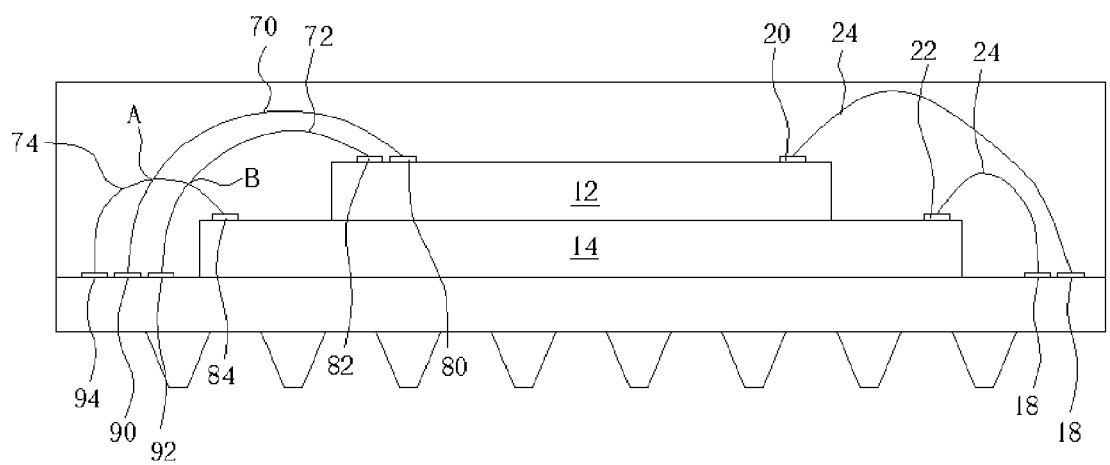
FIG. 2 is a side view of the wire bonding package shown in FIG. 1.

Of the wire bonding package 30, the bonding line 74 indirectly connects the die pad 84 of the second die 14 to the pin 94 of the housing 16 via a first via 62 and a second via 64, instead of directly connecting the die pad 84 to the pin 94 and crossing the bonding line 70 as well as the bonding line 72, as shown in FIG. 1. The part of the bonding line 74 between the first via 62 and the second via 64 has a layout on a bottom side of the circuit board 48, a dashed-line shown in FIG. 3 indicating the part. The part of the bonding line 74 on the bottom side of the circuit board 48 is a trace of the housing 16. The bonding line 70 has a connection manner the same as that of the bonding line 70 shown in FIG. 1 and directly connects the die pad 80 of the first die 12 to the pin 90 of the housing 16. The bonding line 72 indirectly connects the die pad 82 of the first die 12 to the pin 92 of the housing 16 via a first solder pad 66 and a second solder pad 68, instead of directly connecting the die pad 92 to the pin 94, and stays away from the bonding line 70 as far as it can to reduce the coupling effect. The part of the bonding line 72 between the first solder pad 66 and the second solder pad 68 has a layout on a top side of the circuit board 48, a solid-line shown in FIG. 3 indicating the part. The part of the bonding line 70 on the top side of the circuit board 48 is another trace of the housing 16.

The circuit board 48 further comprises at least a passive component 50 installed according to the electric characteristics of the core circuit and the input/output circuits of the first die 12 as well as of the second die 14.

The wire bonding package 30 shown in FIG. 3 has two stacked die, that is the first die 12 and the second die 14. Alternatively, a wire bonding package of the present invention can have only one die or more than two stacked die. Selectively, a bonding line of the wire bonding package can directly connect a pin of the housing 16 and a die pad either of the first die 12 or of the second die 14, or indirectly connect the pin to the die via at least one solder pad or at least two vias to eliminate the bonding line crossing problem. The part of the bonding line between the two vias can have a layout on any layer of the circuit board. Since it is well known by those skilled in the relevant art, further description hereby omitted.

Figure 5:
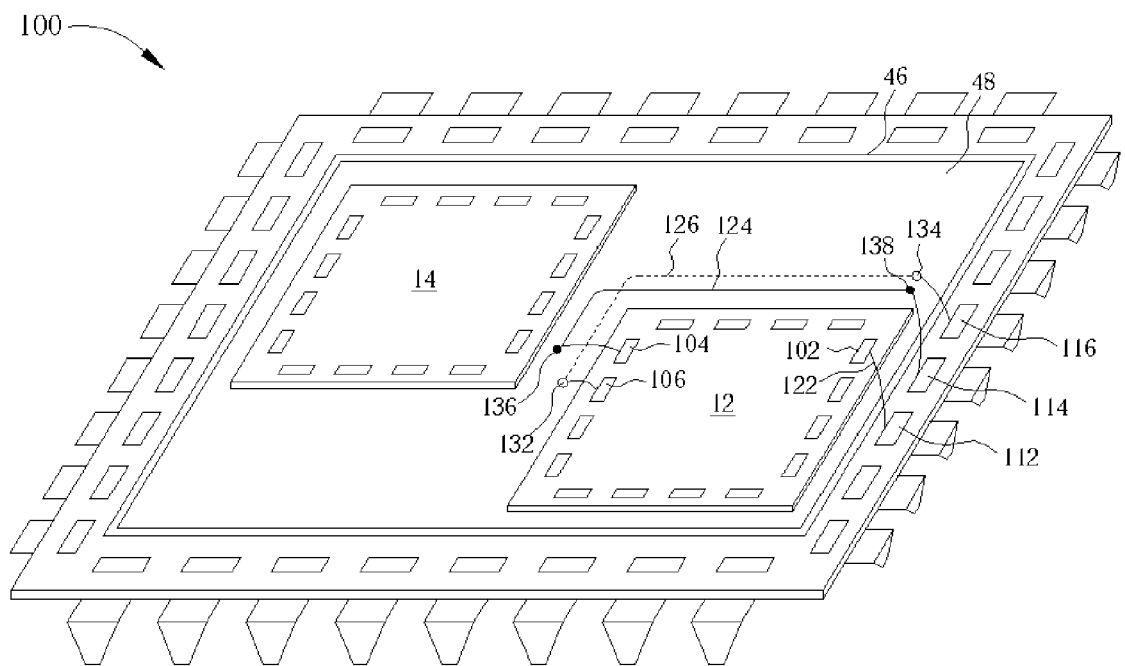
FIG. 5 is a schematic diagram of another wire bonding package of a second embodiment according to the present invention.

The first die 12 and the second die 14 of the wire bonding package 30 shown in FIG. 3 are stacked together on the circuit board 48. Alternatively, die of a wire bonding package of the present invention can adhere to a circuit board. Please refer to FIG. 5, which is a schematic diagram of a wire bonding package 100 of a second embodiment according to the present invention. Besides that both the first die 12 and the second die 14 are adhered to the circuit board 48 by the bare chip technique, the wire bonding package 100 has a structure similar to that of the wire bonding package 30.

Of the wire bonding package 100, a bonding line 122 connects a die pad 102 of the first die to a pin 112 of the housing 16 directly, a bonding line 124 connects a die pad 104 of the first die 12 to a pin 114 of the housing indirectly via a third solder pad 136 and a fourth solder pad 138, the part of the bonding line 124 between the third solder pad 136 and the fourth solder pad 138 having a layout on the top side of the circuit board 48, and a bonding line 126 connects a die pad 106 of the first die 12 to a pin 116 of the housing 16 via first a third via 132 and then a fourth via 134, the part of the bonding line 126 between the third via 132 and the fourth via 134 having a layout on the bottom side of the circuit board 48.

In contrast to the prior art, the present invention can provide a wire bonding package comprising not only a die, a housing, and at least a bonding line, the wire bonding package further comprises a circuit board for the bonding line to be installed onto. The wire bonding package of the present invention has at least the following advantages:

1. The bonding line can connect a die pad of the die to a pin of the housing selectively via at least two vias, the part of the bonding line between the two via shaving a layout on any layer of the circuit board, so that the bonding line crossing problem can be eliminated. Therefore, without being re-designed, a plurality of die of the wire bonding package can be integrated into the housing directly to meet the demand for time-to-market;

2. The bonding line can connect a die pad of the die to a pin of the housing selectively via at least one solder pad to eliminate the coupling effect resulting from the bonding lines being too crowded and to increase the performance, the part of the bonding line neighboring the solder pad being installed away from any bonding lines of the wire bonding package; and 3. The circuit board can have at least a passive component installed according to the electric characteristics of the core circuit and the input/output circuits of the die. Therefore, when in fabrication, a circuit board having the wire bonding package installed does not have to have other properly selected and elaborately tuned passive components installed, so that the cost and time to manufacture the wire bonding package is reduced dramatically.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A wire bonding package comprising:
   a housing having a plurality of pins installed;
   a circuit board installed inside the housing, the circuit board comprising at least a trace connected to the pins of the housing;
   at least a die installed on the circuit board, the die having a plurality of bonding pads installed;
   at least a first bonding line connected between the bonding pads of the die and the trace of the circuit board so that the bonding pads of the die are electrically connected to the pins of the housing; and at least one solder pad soldered to the first bonding line at a point on the first bonding line between the bonding pad of the die and the trace of the circuit board.

2. The wire bonding package of claim 1, wherein the housing comprises a lead frame for accommodating the circuit board.

3. The wire bonding package of claim 1 comprising a plurality of die stacked on the circuit board.

4. The wire bonding package of claim 1 comprising a plurality of die, at least two of the die adhering to the circuit board.

5. The wire bonding package of claim 1, wherein the housing is a ball grid array (BGA).

6. The wire bonding package of claim 1, wherein the housing is a quad flat package (QFP).

7. The wire bonding package of claim 1, wherein the housing is a dual in-line package (DIP).

8. The wire bonding package of claim 1 further comprising at least a passive component installed on the circuit board.

9. The wire bonding package of claim 1 wherein the solder pad is located on the circuit board for soldering the first bonding line to the circuit board.

* * * * *